United States Patent
Oyamada et al.

(10) Patent No.: US 10,444,413 B2
(45) Date of Patent: Oct. 15, 2019

(54) BLACK MOLDED BODY AND LIGHT REFLECTIVE MOLDED BODY AND METHOD FOR PRODUCING BLACK MOLDED BODY

(71) Applicant: ASAHI KASEI KABUSHIKI KAISHA, Chiyoda-ku, Tokyo (JP)

(72) Inventors: Hiroshi Oyamada, Tokyo (JP); Toru Yamaguchi, Tokyo (JP)

(73) Assignee: ASAHI KASEI KABUSHIKI KAISHA, Chiyoda-ku, Tokyo (JP)

( * ) Notice: Subject to any disclaimer, the term of this patent is extended or adjusted under 35 U.S.C. 154(b) by 251 days.

(21) Appl. No.: 15/622,425

(22) Filed: Jun. 14, 2017

(65) Prior Publication Data

US 2018/0364401 A1    Dec. 20, 2018

(51) Int. Cl.
| | |
|---|---|
| C08J 3/22 | (2006.01) |
| G02B 5/08 | (2006.01) |
| C08L 71/12 | (2006.01) |
| C08L 53/02 | (2006.01) |
| C23C 14/14 | (2006.01) |
| G02B 1/00 | (2006.01) |
| F21S 41/37 | (2018.01) |

(52) U.S. Cl.
CPC ............... *G02B 5/08* (2013.01); *C08L 53/02* (2013.01); *C08L 53/025* (2013.01); *C08L 71/123* (2013.01); *C23C 14/14* (2013.01); *G02B 1/00* (2013.01); *F21S 41/37* (2018.01)

(58) Field of Classification Search
CPC .. G02B 1/00; G02B 5/08; C08L 53/02; C08L 53/025; C08L 71/123; C23C 14/14; C08J 3/22; C08J 3/226
See application file for complete search history.

(56) References Cited

FOREIGN PATENT DOCUMENTS

| | | |
|---|---|---|
| JP | H0797442 A | 4/1995 |
| JP | H07145282 A | 6/1995 |
| JP | 2002079540 A | 3/2002 |
| JP | 2009221387 A | 10/2009 |
| JP | 2013213132 A | 10/2013 |
| JP | 2016138200 A | 8/2016 |

*Primary Examiner* — Edward J Cain
(74) *Attorney, Agent, or Firm* — KENJA IP Law PC

(57) ABSTRACT

Provided is a black shaped product having low specific gravity, an excellent balance of heat resistance and fluidity, extremely few white spots at the shaped product surface, and excellent aluminum vapor deposition external appearance. The black shaped product is obtained through shaping of a resin composition containing 5 mass % to 95 mass % of a polyphenylene ether (A), 2 mass % to 94.96 mass % of a styrene resin (B), and 0.04 mass % to 3 mass % of carbon black (C). The black shaped product includes a mirror surface part at the surface thereof. The number of white spots present within a 52.4 $mm^2$ area of the mirror surface part is 30 or less.

2 Claims, No Drawings

BLACK MOLDED BODY AND LIGHT REFLECTIVE MOLDED BODY AND METHOD FOR PRODUCING BLACK MOLDED BODY

TECHNICAL FIELD

This disclosure relates to a black shaped product, a light-reflective shaped product, and a method of producing a black shaped product.

BACKGROUND

Conventional examples of materials that are widely used for resin-made components that reflect light, such as components for automobile lamps and the like, include thermosetting resins such as unsaturated polyester resin and bulk molding compound (BMC), and aluminum-made materials. Although thermosetting resins are superior to aluminum-made materials in terms of being light-weight, there is demand for further weight reduction. Moreover, thermosetting resins also suffer from problems such as the complexity of an operation for vapor depositing aluminum on a shaped product and contamination of an operational environment with dust and the like.

Consequently, there is progress toward switching materials to thermoplastic resins such as polyetherimide and high-heat resistance polycarbonate for which the operation of aluminum vapor deposition is simple. However, these thermoplastic resins are not sufficiently light-weight and a material having even lower specific gravity would be desirable in consideration of environmental impact and energy efficiency.

Polyphenylene ether resins have properties such as excellent mechanical properties, electrical properties, acid resistance, alkali resistance, and heat resistance, low specific gravity and water absorbency, and good dimensional stability. Accordingly, polyphenylene ether resins are widely used as materials for home appliances, OA devices, office machines, information devices, automobiles, and so forth.

It is also anticipated that due, in particular, to their property of low specific gravity, polyphenylene ether resin compositions may be used in light-reflective shaped product applications. However, when a polyphenylene ether resin composition is used in such an application, there is demand for higher heat resistance and rigidity, better shaping fluidity, higher light reflection properties, and greater ease of aluminum vapor deposition. Moreover, a shaped product thereof is expected to have good surface external appearance, brightness, and so forth.

The addition of an inorganic filler such as glass fiber, carbon fiber, mica, or talc is commonly used as a method for improving the heat resistance and mechanical properties of a thermoplastic resin including polyphenylene ether resin. However, this method leads to significant loss of toughness of the resin and shaped product surface gloss even when only a small amount of inorganic filler is added, which makes it highly difficult to adopt a resin composition obtained by this method for light-reflective shaped product applications.

Moreover, compounding of rubber-reinforced polystyrene (high-impact polystyrene; HIPS) is widely adopted for imparting impact resistance on polyphenylene ether resins. However, compounding of rubber-reinforced polystyrene tends to lead to loss of brightness of the resultant shaped product in the same manner as when an inorganic filler is added.

A resin composition that is provided with an excellent balance of light weight, heat resistance, fluidity, and mechanical properties through a blend of a polyphenylene ether resin and a liquid-crystal polyester has been disclosed as a technique in relation to automobile lamp components formed from polyphenylene ether resin compositions (for example, refer to PTL 1).

Moreover, a technique has been disclosed in relation to a resin composition suitable for automobile lamp component applications and the like that has improved resin heat aging resistance and film shaped product external appearance as a consequence of a specific stabilizer being added to a resin composition containing a polyphenylene ether resin in a relatively high concentration (for example, refer to PTL 2).

Furthermore, a technique has been disclosed for improving a conventional polyphenylene ether resin in terms of heat stability, white spots (protrusions of 30 μm or more in diameter that are formed in a shaped product due to the presence of pigment aggregates in proximity to the surface of the shaped product), and so forth by modifying the polyphenylene ether resin with an acrylic acid ester, such as stearyl acrylate, or the like (for example, refer to PTL 3, 4, and 5).

CITATION LIST

Patent Literature

PTL 1: JP 2002-079540 A
PTL 2: JP 2009-221387 A
PTL 3: JP H07-097442 A
PTL 4: JP H07-145282 A
PTL 5: JP 2013-213132 A

SUMMARY

Technical Problem

However, the aforementioned techniques suffer from problems such as described below. Specifically, the resin composition described in PTL 1 has excellent heat resistance and shaping fluidity as a consequence of addition of the liquid-crystal polyester, but this may also result in loss of shaped product brightness. Therefore, the resin composition described in PTL 1 is not necessarily satisfactory as a material for light-reflective shaped product applications and leaves room for further improvement.

The resin composition described in PTL 2 has improved heat aging resistance as a consequence of addition of the specific stabilizer, but PTL 2 does not provide any description in relation to white spots in a shaped product or in relation to remediation of such white spots, and the claims and examples in PTL 2 do not consider a technique for effective remediation of white spots present in a light-reflective shaped product after aluminum vapor deposition. Therefore, PTL 2 does not teach a technique for preferable improvement of a resin composition used in a light-reflective shaped product application.

Resin compositions described in PTL 3 and 4 display effects such as suppression of the formation of silver streaks in a shaped product under high-temperature shaping conditions, compared to conventional polyphenylene ether resins, as a consequence of polyphenylene ether resin modification with an acrylic acid ester compound, such as stearyl acrylate, or the like. However, PTL 3 and 4 do not provide any description in relation to white spots in a shaped product or in relation to remediation of such white spots, and the claims and examples in PTL 3 and 4 do not include any matter that suggests use in a light-reflective shaped product. Therefore, PTL 3 and 4 do not teach a technique for preferable improvement of a resin composition used in a light-reflective shaped product application.

A resin shaped product described in PTL 5 enables remediation of white spots through inclusion of a (meth) acrylic acid ester such as stearyl acrylate. However, since a shaped product to be used as a light-reflective shaped product is colored black in anticipation of subsequent aluminum vapor deposition thereon, the resin shaped product described in PTL 5 does not enable remediation of white spots caused by a pigment or the like.

Furthermore, conventional polyphenylene ether resin compositions that have been proposed for automobile lamp components and other light-reflective shaped products can be deployed for various applications, but since numerous white spots are observed at the surface of a shaped product obtained therewith, these polyphenylene ether resin compositions result in poor external appearance despite having excellent brightness, and thus are not necessarily satisfactory as materials for use in light-reflective shaped product applications. When many white spots are present, a mirror surface part of a light-reflective shaped product may become uneven.

Accordingly, an objective of the present disclosure is to provide a black shaped product and a light-reflective shaped product that have low specific gravity, extremely few white spots at the surface of the shaped product, and excellent aluminum vapor deposition external appearance, and also to provide a method of producing a black shaped product.

Solution to Problem

The inventors conducted diligent investigation to solve the problems set forth above. Through this investigation, the inventors discovered that these problems can be solved through a black shaped product that is formed from a resin composition containing 5 mass % to 95 mass % of a polyphenylene ether, 2 mass % to 94.96 mass % of a styrene resin, and 0.04 mass % to 3 mass % of carbon black, and in which no greater than a specific number of white spots are present in a specific area of a mirror surface part of the surface of the shaped product. The disclosed products and methods were completed based on this discovery.

Specifically, the primary features of this disclosure are as follows.

[1] A black shaped product obtained through shaping of a resin composition, the resin composition comprising:
5 mass % to 95 mass % of a polyphenylene ether (A);
2 mass % to 94.96 mass % of a styrene resin (B); and
0.04 mass % to 3 mass % of carbon black (C), wherein
the black shaped product obtained through shaping of the resin composition includes a mirror surface part at a surface thereof, and
the number of white spots present within a 52.4 mm$^2$ area of the mirror surface part is 30 or less.

[2] The black shaped product according to the foregoing [1], wherein
the resin composition further comprises 5 parts by mass to 40 parts by mass of a styrene thermoplastic elastomer (D) that is a hydrogenated product of a block copolymer including a styrene block and a conjugated diene compound block per 100 parts by mass, in total, of the (A) component, the (B) component, and the (C) component.

[3] The black shaped product according to the foregoing [1] or [2] used as an automobile lamp reflector shaped product.

[4] A light-reflective shaped product obtained through aluminum vapor deposition performed with respect to the surface of the black shaped product according to the foregoing [1] or [2] as a base, wherein the light-reflective shaped product is used as an automobile lamp extension shaped product.

[5] A method of producing a black shaped product comprising:
producing a carbon black masterbatch (C') that passes through a No. 9 mesh having a 2 mm opening size in an amount of 90% or more by mixing and pulverizing 40 mass % to 60 mass % of a styrene resin (B) and 40 mass % to 60 mass % of carbon black (C);
producing a resin composition by melt-kneading 5 mass % to 95 mass % of a polyphenylene ether (A), 4.9 mass % to 90 mass % of a styrene resin (B), and 0.1 mass % to 5 mass % of the carbon black masterbatch (C'); and
subsequently shaping the resin composition.

[6] The method of producing a black shaped product according to the foregoing [5], wherein
in production of the carbon black masterbatch (C'), the styrene resin (B) and the carbon black (C) are melt-mixed using a Banbury mixer, a Labo Plastomill, or a roll other than an extruder, and a resultant melt-mixed product is cooled and subsequently pulverized.

Advantageous Effect

According to the present disclosure, it is possible to obtain a black shaped product having extremely few white spots at the surface of the shaped product and excellent aluminum vapor deposition external appearance. The black shaped product can be favorably used as a light-reflective shaped product such as a lamp reflector or lamp extension shaped product of an automobile.

DETAILED DESCRIPTION

The following provides a detailed description of an embodiment of the present disclosure (hereinafter, referred to as "the present embodiment"). It should be noted that the present disclosure is not limited to the following embodiment and that various modifications may be made within the essential scope thereof in implementation.

[Black Shaped Product]

A black shaped product according to the present embodiment is a black shaped product (hereinafter, also referred to simply as a "shaped product") obtained through shaping of a resin composition that contains 5 mass % to 95 mass % of a polyphenylene ether (A), 2 mass % to 94.96 mass % of a styrene resin (B), and 0.04 mass % to 3 mass % of carbon black (C). The black shaped product obtained through shaping of the resin composition includes a mirror surface part at the surface thereof and the number of white spots (protrusions of 30 μm or more in diameter) within a 52.4 mm$^2$ area of the mirror surface part is 30 or less.

—Resin Composition—

——Polyphenylene Ether (A)——

The reduced viscosity of the polyphenylene ether (A) (hereinafter, also referred to simply as the "(A) component") used in the present embodiment is preferably 0.25 dL/g to 0.55 dL/g, more preferably 0.25 dL/g to 0.45 dL/g, even more preferably 0.30 dL/g to 0.42 dL/g, and particularly preferably 0.30 dL/g to 0.40 dL/g. The reduced viscosity of the polyphenylene ether (A) is preferably 0.25 dL/g or more from a viewpoint of obtaining adequate mechanical properties and is preferably 0.55 dL/g or less from a viewpoint of shaping workability and brightness of the shaped product. In the present embodiment, the reduced viscosity is a value obtained by measuring a 0.5 g/dL solution at 30° C. using chloroform solvent.

The polyphenylene ether (A) preferably has the following formula (1a) or (1b) as a repeating unit, and is preferably a homopolymer composed of constitutional units represented by general formula (1a) or (1b), or a copolymer.

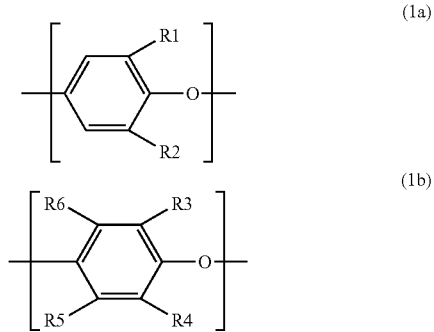

R1, R2, R3, R4, R5, and R6 in the preceding formulae (1a) and (1b) are preferably each, independently of one another, a monovalent residue such as an alkyl group having a carbon number of 1 to 4, an aryl group having a carbon number of 6 to 12, a halogen atom, or a hydrogen atom. However, a case in which R5 and R6 are both hydrogen atoms is excluded. Moreover, the carbon number of the alkyl group is more preferably 1 to 3, the carbon number of the aryl group is more preferably 6 to 8, and the monovalent residue is more preferably a hydrogen atom. The number of repeating units represented by the preceding formulae (1a) and (1b) that are included is not specifically limited and may be various values depending on the molecular weight distribution of the polyphenylene ether (A).

Examples of homopolymers that can be used as the polyphenylene ether (A) include, but are not limited to, poly(2,6-dimethyl-1,4-phenylene) ether, poly(2-methyl-6-ethyl-1,4-phenylene) ether, poly(2,6-diethyl-1,4-phenylene) ether, poly(2-ethyl-6-n-propyl-1,4-phenylene) ether, poly(2,6-di-n-propyl-1,4-phenylene) ether, poly(2-methyl-6-n-butyl-1,4-phenylene) ether, poly(2-ethyl-6-isopropyl-1,4-phenylene) ether, poly(2-methyl-6-chloroethyl-1,4-phenylene) ether, poly(2-methyl-6-hydroxyethyl-1,4-phenylene) ether, and poly(2-methyl-6-chloroethyl-1,4-phenylene) ether. Of these homopolymers, poly(2,6-dimethyl-1,4-phenylene) ether is preferable in terms of ease of raw material acquisition and processability.

Examples of copolymers that can be used as the polyphenylene ether (A) include, but are not limited to, copolymers composed mainly of a polyphenylene ether structure such as a copolymer of 2,6-dimethylphenol and 2,3,6-trimethylphenol, a copolymer of 2,6-dimethylphenol and o-cresol, and a copolymer of 2,3,6-trimethylphenol and o-cresol. Of these copolymers, a copolymer of 2,6-dimethylphenol and 2,3,6-trimethylphenol is preferable from a viewpoint of ease of raw material acquisition and processability, and a copolymer formed from 90 mass % to 70 mass % of 2,6-dimethylphenol and 10 mass % to 30 mass % of 2,3,6-trimethylphenol is more preferable from a viewpoint of improving physical properties.

The polyphenylene ether (A) may be a single type used individually or a combination of two or more types.

Moreover, the polyphenylene ether (A) may include another type of phenylene ether unit as a partial structure to an extent that does not cause deviation from the effects desired in the present embodiment. Examples of such other types of phenylene ether units include, but are not limited to, a 2-(dialkylaminomethyl)-6-methylphenylene ether unit and a 2-(N-alkyl-N-phenylaminomethyl)-6-methylphenylene ether unit described in JP H01-297428 A and JP S63-301222 A.

A small amount of diphenoquinone or the like may be bonded in the main chain of the polyphenylene ether. Moreover, some or all the polyphenylene ether may be functionalized polyphenylene ether obtained through reaction (modification) with a functionalizing agent including at least one selected from the group consisting of an acyl functional group, a carboxylic acid, an acid anhydride, an acid amide, an imide, an amine, an orthoester, a hydroxy, or a carboxylic acid ammonium salt.

The ratio of the weight average molecular weight Mw and the number average molecular weight Mn (Mw/Mn value) of the polyphenylene ether (A) is preferably 2.0 to 5.5, more preferably 2.5 to 4.5, and even more preferably 3.0 to 4.5. The Mw/Mn value is preferably 2.0 or more from a viewpoint of shaping workability of the resin composition and is preferably 5.5 or less from a viewpoint of mechanical properties of the resin composition.

The weight average molecular weight Mw and the number average molecular weight Mn can be obtained from the polystyrene-converted molecular weight.

Residual volatile content in the polyphenylene ether (A) is preferably 0.3 mass % (3,000 ppm) or less, and more preferably 0.1 mass % (1,000 ppm) or less from a viewpoint of improving the surface external appearance of the shaped product. Polyphenylene ether in which the residual volatile content is 0.3 mass % or less can be suitably produced by, for example, adjusting the drying temperature and/or drying time after polyphenylene ether polymerization, but is not limited this method. The drying temperature is, for example, 40° C. to 200° C., preferably 80° C. to 180° C., and more preferably 120° C. to 170° C. A drying temperature of 40° C. or higher is preferable from a viewpoint of drying efficiency and a drying temperature of 200° C. or lower is preferable from a viewpoint of preventing scorching or deterioration due to melting.

The drying time is, for example, 0.5 hours to 72 hours, preferably 2 hours to 48 hours, and more preferably 6 hours to 24 hours. In a situation in which residual volatile content in the polyphenylene ether (A) is to be removed in a relatively short time, the polyphenylene ether (A) is preferably dried at 40° C. to 200° C. In this situation, drying in a nitrogen atmosphere or drying using a vacuum dryer is appropriate for preventing deterioration caused by heat.

In order to reduce the residual volatile content in the polyphenylene ether (A) to within any of the ranges set forth above through drying performed after polymerization, it is preferable to perform polymerization using a polymerization solvent that does not negatively affect polymerization, has almost no negative impact on the environment, and has a relatively low boiling point such as to be easily volatilized. The polymerization solvent may, for example, be toluene, but is not limited thereto. More specifically, polyphenylene ether having a residual volatile content within any of the ranges set forth above can be produced by performing polymerization by a commonly known polymerization method to obtain polyphenylene ether having a reduced viscosity within any of the ranges set forth above, and subsequently drying the resultant polymer sufficiently using a vacuum dryer or the like. It should be noted that even when a polymerization solvent other than the preferred polymerization solvent described above is used, polyphenylene ether having a residual volatile content within any of the ranges set forth above can still be produced through sufficient drying.

The content of the polyphenylene ether (A) used in the present embodiment in 100 mass % of the resin composition is 5 mass % to 95 mass %, preferably 50 mass % to 95 mass %, more preferably 60 mass % to 90 mass %, and even more preferably 65 mass % to 85 mass %. A polyphenylene ether (A) content of 50 mass % or more is preferable from a viewpoint of obtaining the heat resistance required for the applications described herein and a polyphenylene ether (A) content of 95 mass % or less is preferable from of viewpoint of preserving external appearance and brightness of the shaped product.

——Styrene Resin (B)——

The styrene resin (B) is a polymer that is obtained by polymerizing a styrene compound, and optionally a compound that is copolymerizable therewith as necessary, either in the presence or absence of a rubbery polymer.

The resin composition used in the present embodiment contains the styrene resin (B) (hereinafter, also referred to simply as the "(B) component") in an amount of 2 mass % to 94.96 mass % and preferably 3 mass % to 49.9 mass % in 100 mass % of the resin composition from a viewpoint of improving shaping workability and improving external appearance and brightness of the shaped product. The content of the styrene resin (B) is more preferably 3 mass % to 40 mass %, and even more preferably 5 mass % to 35 mass %. A styrene resin (B) content of 49.9 mass % or less is preferable from a viewpoint of obtaining the heat resistance required for applications described herein and a styrene resin (B) content of 3 mass % or more is preferable from a viewpoint of shaped product brightness, enhancement of shaping fluidity, and so forth.

Examples of the styrene resin (B) include, but are not limited to, homopolystyrene, rubber-reinforced polystyrene (HIPS), styrene-acrylonitrile copolymer (AS resin), and styrene-rubbery polymer-acrylonitrile copolymer (ABS resin).

Examples of the aforementioned styrene compound include, but are not limited to, styrene, α-methylstyrene, 2,4-dimethylstyrene, monochlorostyrene, p-methylstyrene, p-tert-butylstyrene, and ethylstyrene. The styrene compound is preferably styrene.

Examples of the compound that is copolymerizable with the styrene compound include, but are not limited to, methacrylic acid esters such as methyl methacrylate and ethyl methacrylate; unsaturated nitrile compounds such as acrylonitrile and methacrylonitrile; and acid anhydrides such as maleic anhydride.

The amount of the compound that is copolymerizable with the styrene compound relative to 100 mass %, in total, of the styrene compound and the copolymerizable compound is preferably 20 mass % or less, and more preferably 15 mass % or less.

At least one selected from the group consisting of polystyrene and styrene-acrylonitrile resin (AS resin) is preferably included as the styrene resin (B).

The styrene resin (B) used in the present embodiment may include a rubbery polymer formed from a polymer of butadiene, isoprene, or the like from a viewpoint of improving impact resistance and the like.

Examples of the rubbery polymer include, but are not limited to, conjugated diene rubbers, copolymers of conjugated dienes and aromatic vinyl compounds, and ethylene-propylene copolymer rubbers. Specifically, polybutadiene and styrene-butadiene copolymer are preferable.

Moreover, when an unsaturated rubbery polymer is used, it is preferable to use partially hydrogenated polybutadiene having a degree of unsaturation of 80% to 20% or polybutadiene in which the proportion of 1,4-cis bonding is 90% or more.

By adding the (B) component described above to the polyphenylene ether (A), melt fluidity in shaping can be enhanced, and external appearance and brightness of the shaped product can be improved while minimizing loss of heat resistance of the polyphenylene ether (A).

The styrene resin (B) may be a single type used individually or a combination of two or more types.

——Non-Rubber-Reinforced Styrene Resin——

The (B) component used in the present embodiment is preferably a styrene resin that is not reinforced with rubber.

The non-rubber-reinforced styrene resin that is used in the present embodiment is a synthetic resin obtained through polymerization of a styrene compound, or through polymerization of a styrene compound and a compound that is copolymerizable therewith, in the absence of a rubbery polymer formed from butadiene, isoprene, or the like. The styrene compound is a compound represented by the following formula (2).

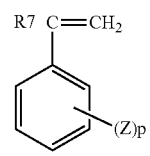

(2)

In the preceding formula (2), R7 is hydrogen, a lower alkyl, or a halogen, Z is at least one selected from the group consisting of a vinyl group, a hydrogen atom, a halogen, and a lower alkyl group, and p is an integer of 1 to 5.

Specific examples of compounds represented by formula (2) include, but are not limited to, styrene, α-methylstyrene, 2,4-dimethylstyrene, monochlorostyrene, p-methylstyrene, p-tert-butylstyrene, and ethylstyrene. The compound that is copolymerizable with the styrene compound may, for example, be a methacrylic acid ester such as methyl methacrylate or ethyl methacrylate; an unsaturated nitrile compound such as acrylonitrile or methacrylonitrile; an acid anhydride such as maleic anhydride; or the like. The copolymerizable compound is used with the styrene compound.

Of such examples, the non-rubber-reinforced styrene resin is preferably styrene-acrylonitrile (AS) resin.

The content of acrylonitrile (AN) units in the AS resin is preferably 5 mass % to 15 mass %, more preferably 5 mass % to 12 mass %, and even more preferably 7 mass % to 10 mass % from a viewpoint of improving the surface external appearance of the resultant shaped product and ensuring sufficient miscibility with polyphenylene ether. The method by which the content of AN units in the AS resin is controlled to within any of the ranges set forth above may, for example, be adjustment of the charged amount of AN in production of the AS resin.

The non-rubber-reinforced styrene resin is more preferably a styrene-acrylonitrile (AS) resin in which the content of acrylonitrile (AN) units is 5 mass % to 15 mass %.

The non-rubber-reinforced styrene resin that is used in the present embodiment may be a single type used individually or a combination of two or more types.

When a non-rubber-reinforced styrene resin is used as the (B) component in the present embodiment, the proportion of the entire resin composition composed by the non-rubber-reinforced styrene resin is preferably 3 mass % to 40 mass %. The proportion composed by the non-rubber-reinforced styrene resin is more preferably 5 mass % to 35 mass %, and even more preferably 10 mass % to 35 mass %. The non-rubber-reinforced styrene resin is preferably contained in a proportion of 3 mass % or more from a viewpoint of improving external appearance of the shaped product and enhancing shaping fluidity and is preferably contained in a proportion of 40 mass % or less from a viewpoint of obtaining sufficient heat resistance.

——Carbon Black (C)——

The resin composition used in the present embodiment contains 0.04 mass % to 3 mass % of carbon black (C) (hereinafter, also referred to simply as the "(C) component") in 100 mass % of the resin composition. More specifically, the resin composition of the present embodiment may, for example, contain the carbon black (C) through melt-kneading of a carbon black masterbatch (C') (hereinafter, also referred to simply as the "(C') component") that contains the (C) component with the (A) component, the (B) component, and so forth.

——Carbon Black Masterbatch (C')——

The carbon black masterbatch (C') has a pulverized average diameter of 1 mm or less and is compounded in an amount of 0.1 mass % to 5 mass % in 100 mass % of the resin composition from a viewpoint of improving the external appearance of the shaped product surface after aluminum vapor deposition (i.e., reducing white spots). The amount of the carbon black masterbatch (C') that is compounded in the resin composition used in the present embodiment is preferably 0.5 mass % to 4 mass %, and more preferably 0.6 mass % to 3 mass %.

The amount of the carbon black masterbatch (C') compounded in the resin composition used in the present embodiment is preferably 0.1 mass % or more from a viewpoint of obtaining the black coloring prior to aluminum vapor deposition that is required for the applications described herein and is preferably 5 mass % or less from a viewpoint of preserving the external appearance of the shaped product (i.e., inhibiting the occurrence of silver coloring).

The carbon black masterbatch (C') according to the present disclosure is formed from 40 mass % to 60 mass % of a styrene resin (B) and 40 mass % to 60 mass % of carbon black (C), and preferably 45 mass % to 55 mass % of the (B) component and 55 mass % to 45 mass % of the (C) component. When the proportions of the styrene resin (B) and the carbon black (C) are as set forth above, the carbon black (C) can be dispersed in the resin composition and good external appearance and brightness can be efficiently obtained.

Note that in a situation in which the carbon black (C) is kneaded and compounded with the (A) component, the (B) component, and so forth in the resin composition of the present embodiment as the carbon black masterbatch (C') containing the (C) component, since styrene resin (B) is contained in the carbon black masterbatch (C'), the compounded amount of the (B) component that is kneaded with the (A) component and the (C') component in production of the resin composition can be set as 4.9 mass % to 90 mass % in 100 mass % of the resin composition.

From a viewpoint of coloring strength and dispersibility, the carbon black (C) preferably has a primary particle diameter of 15 nm to 22 nm, a nitrogen adsorption specific surface area of 200 $m^2/g$ to 270 $m^2/g$, a DBP oil absorption amount of 40 $cm^3/100$ g to 80 $cm^3/100$ g, a pH of 6 to 8, and a volatile content of 0% to 3%.

The styrene resin (B) and the carbon black (C) used in the carbon black masterbatch (C') may each be a single type or a combination of two or more types. Furthermore, so long as the styrene resin (B) that is used in the carbon black masterbatch (C') and the (B) component that is kneaded with the (A) component and the (C') component in production of the resin composition after production of the carbon black masterbatch (C') are both styrene resins, they may be the same type of resin or different types of resins.

——Method of Producing Carbon Black Masterbatch (C')——

The carbon black masterbatch (C') used in the present embodiment can be produced, for example, by mixing the styrene resin (B) and the carbon black (C) in advance using a high-speed mixer or the like, representative examples of which include a tumbler mixer and a Henschel mixer, subsequently mixing the resultant mixture at a temperature at which the styrene resin (B) melts (for example, 170° C. to 230° C.) using a Labo Plastomill, a Banbury mixer, a roll, or the like, either individually or in combination, subsequently cooling the resultant mixture, and then carrying out pulverization using a pulverizer. The carbon black masterbatch (C') may be classified using a No. 9 mesh (2 mm opening size) standard sieve.

Aggregates of the carbon black (C) tend to form if granulation of the carbon black masterbatch (C') is performed using an extruder. However, when the carbon black masterbatch (C') is only processed using the mixers described above and then pulverized to obtain a composition, it is possible to obtain an excellent dispersion state of the carbon black (C).

During the above, a wax such as a fatty acid metal salt, fatty acid ester, or fatty acid amide may be mixed as an auxiliary dispersant, as appropriate, in an effective amount for inhibiting aggregation of the carbon black (C).

The carbon black masterbatch (C') passes through a No. 9 mesh (2 mm opening size) in an amount of 90% or more.

——Styrene Thermoplastic Elastomer (D)——

The resin composition used in the present embodiment preferably further contains a styrene thermoplastic elastomer (D) (hereinafter, also referred to simply as the "(D) component") from a viewpoint of improving impact resistance of the resin composition. The content of the (D) component per 100 parts by mass, in total, of the (A), (B), and (C) components in the resin composition used in the present embodiment is preferably 5 parts by mass to 40 parts by mass, more preferably 5 parts by mass to 20 parts by mass, and even more preferably 5 parts by mass to 15 parts by mass. A (D) component content of 5 parts by mass or more is preferable from a viewpoint of imparting impact resistance and a (D) component content of 40 parts by mass or less is preferable from a viewpoint of maintaining sufficient heat resistance and rigidity.

The styrene thermoplastic elastomer (D) is a hydrogenated product of a block copolymer including a styrene block and a conjugated diene compound block (hereinafter, also referred to as a "styrene block-conjugated diene compound block copolymer"). The conjugated diene compound block is preferably hydrogenated with a hydrogenation rate of 50% or more from a viewpoint of heat stability. The hydrogenation rate is more preferably 80% or more, and even more preferably 95% or more.

The styrene thermoplastic elastomer (D) may be a single type used individually or a combination of two or more types.

Examples of the conjugated diene compound block include, but are not limited to, polybutadiene, polyisoprene, poly(ethylene-butylene), poly(ethylene-propylene), and vinyl-polyisoprene. The conjugated diene compound block may be a single type used individually or a combination of two or more types.

The arrangement of repeating units constituting the block copolymer may be a linear type or a radial type. Moreover, polystyrene blocks and rubber intermediate blocks may form a two, three, or four block structure. Among such block copolymers, a tri-block linear-type block copolymer formed from a polystyrene-poly(ethylene-butylene)-polystyrene structure is preferable from a viewpoint of sufficiently exhibiting the effects that are desired in the present embodiment. Note that the conjugated diene compound block may include butadiene units in a range not exceeding 30 mass %.

Moreover, in the resin composition used in the present embodiment, a functionalized styrene thermoplastic elastomer obtained by introducing a functional group such as a carbonyl group or an amino group into a styrene thermoplastic elastomer may be used as the (D) component.

A carbonyl group can be introduced through modification with an unsaturated carboxylic acid or a functional derivative thereof. Examples of unsaturated carboxylic acids and functional derivatives thereof that can be used include, but are not limited to, maleic acid, fumaric acid, itaconic acid, citric acid, halogenated maleic acid, cis-4-cyclohexene-1,2-dicarboxylic acid, and endo-cis-bicyclo[2,2,1]-5-heptene-2,3-dicarboxylic acid; anhydrides, ester compounds, amide compounds, and imide compounds of these dicarboxylic acids; acrylic acid and methacrylic acid; and ester compounds and amide compounds of these monocarboxylic acids. Of these examples, maleic anhydride is preferable from a viewpoint of preserving the surface external appearance of the shaped product and imparting impact resistance.

An amino group can be introduced by reacting an imidazolidinone compound, a pyrrolidone compound, or the like with the styrene thermoplastic elastomer.

The resin composition used in the present embodiment preferably contains a hydrogenated product of a styrene-conjugated diene compound block copolymer having a bound styrene amount of 45 mass % to 80 mass % as the (D) component from a viewpoint of enhancing shaped product gloss, further imparting impact resistance, and preventing delamination of the shaped product.

——Other Components——

The resin composition used in the present embodiment preferably contains an appropriate amount of a heat stabilizer to obtain an effect of heat stabilization. The type of heat stabilizer is preferably a hindered phenol heat stabilizer or a phosphoric heat stabilizer. Specific examples of hindered phenol heat stabilizers that can be used include 3,3',3",5,5', 5"-hexa-tert-butyl-a,a',a"-(mesitylene-2,4,6-triyl)tri-p-cresol and 1,3,5-tris(3,5-di-tert-butyl-4-hydroxybenzyl)-1,3, 5-triazine-2,4,6(1H,3H,5H)-trione. Specific examples of phosphoric heat stabilizers that can be used include bis(2, 4-dicumylphenyl)pentaerythritol diphosphite and 3,9-bis(2, 6-di-tert-butyl-4-methylphenoxy)-2,4,8,10-tetraoxa-3,9-diphosphaspiro[5,5]undecane.

From a viewpoint of preserving brightness of the shaped product, it is preferable that the resin composition used in the present embodiment does not contain an inorganic filler as a reinforcer. Examples of inorganic fillers that may be used as reinforcers include those commonly used to reinforce thermoplastic resins such as glass fiber, carbon fiber, glass flake, talc, and mica.

Moreover, from a viewpoint of preserving brightness of the shaped product, it is preferable that the resin composition used in the present embodiment does not contain a crystalline polymer. Examples of crystalline polymers that may be used include polyamide, polypropylene, polyethylene, polyphenylene sulfide, polyacetal, polyethylene terephthalate, polybutylene terephthalate, and liquid-crystal polymers.

The specific gravity of the resin composition used in the present embodiment is preferably 1.00 to 1.12, more preferably 1.04 to 1.10, and even more preferably 1.05 to 1.08 from a viewpoint of obtaining a good balance of the benefit of reduced environmental impact that is obtained through weight-reduction and material design that maintains adequate performance (heat resistance, mechanical strength, shaped product external appearance, etc.).

——Method of Producing Resin Composition——

The resin composition used in the present embodiment may be produced, for example, by melt-kneading raw materials containing the polyphenylene ether (A), the styrene resin (B), and the carbon black (C), and optionally other components such as the styrene thermoplastic elastomer (D) as necessary, but is not specifically limited to being produced in this manner. Moreover, the resin composition used in the present embodiment may be produced, for example, by producing the carbon black masterbatch (C') containing the carbon black (C) by the method described above in advance, and subsequently compounding and melt-kneading the (A) component, the (B) component, and the (C') component, and optionally other components such as the (D) component as necessary.

The production method of the resin composition used in the black shaped product according to the present embodiment may, for example, involve melt-kneading raw materials containing the (A) component, the (B) component, and the (C) component using a twin-screw extruder, but is not specifically limited to this method. The resin composition obtained through this production method is preferable in terms of further reducing white spots in the shaped product.

The use of a twin-screw extruder is appropriate from a viewpoint of enabling large-scale and stable production of a resin composition through which the effects desired in the present embodiment are sufficiently exhibited. For example, when a ZSK25 twin-screw extruder (produced by Coperion Inc.; number of barrels: 10; screw diameter: 25 mm; L/D=44; screw pattern including 2 kneading discs L, 6 kneading discs R, and 2 kneading discs N) is used, a method may be adopted in which melt-kneading is performed under conditions of a cylinder temperature of 270° C. to 340° C., a screw rotation speed of 150 rpm to 450 rpm, and a vent degree of vacuum of 11.0 kPa to 1.0 kPa.

When the resin composition used in the present embodiment is produced using a larger-scale twin-screw extruder (screw diameter: 40 mm to 90 mm), it is necessary to consider deterioration of the surface external appearance and brightness of the shaped product that may occur due to gel or carbide produced from the (A) component becoming incorporated into extruded resin pellets during extrusion. Accordingly, it is preferable to feed the (A) component from a furthest upstream raw material feeding inlet (top feed) and to set the oxygen concentration inside a chute of the furthest upstream feeding inlet as 3 volume % or less. The oxygen concentration is more preferably 1 volume % or less.

The oxygen concentration can be adjusted, for example, by sufficiently purging the inside of a raw material storage hopper with nitrogen and improving air-tightness by, for example, affixing tape to seal a feed line from the raw material storage hopper to the raw material feeding inlet of the extruder, and thereby prevent entry or exit of air partway along the feed line, and then adjusting the nitrogen feed amount or adjusting the degree of opening of a gas vent. The oxygen concentration inside the chute is preferably 3 volume % or less from a viewpoint of reducing gel or carbide production during extrusion.

—Method of Producing Black Shaped Product—

The black shaped product according to the present embodiment can be obtained through shaping of the resin composition described above.

Examples of suitable shaping methods for producing the black shaped product using the resin composition include, but are not limited to, injection molding, extrusion molding, vacuum forming, and pressure forming. Injection molding is more suitable, particularly from a viewpoint of external appearance and brightness of the shaped product.

Possible applications for the black shaped product according to the present embodiment include, but are not specifically limited to, light source reflecting components for projectors and various lighting equipment, lamp reflector components for automobiles, and automobile lamp extension components obtained through aluminum vapor deposition performed with respect to the surface of the black shaped product as a base. Of these applications, the black shaped product according to the present embodiment is preferably used as an automobile lamp reflector shaped product or an automobile lamp extension shaped product, and is particularly preferably used as an automobile lamp extension shaped product.

Herein, the term automobile lamp extension shaped product refers to a relatively large light-reflective component that is disposed between a reflector (light-reflective component disposed rearward relative to a light source beam of an automobile headlight) and a lamp front cover. Although an automobile lamp extension shaped product is not required to have as high heat resistance as a reflector, the automobile lamp extension shaped product is required to have good brightness of a shaped product glossy surface, good surface external appearance after aluminum vapor deposition, an adequate balance of heat resistance and shaping fluidity, weight-reduction performance (i.e., be a material having low specific gravity), and so forth to even higher levels.

The shaping temperature of the black shaped product according to the present embodiment is, for example, a cylinder temperature setting (highest temperature section) selected from a range of 270° C. to 340° C., preferably 280° C. to 330° C., more preferably 290° C. to 320° C., and even more preferably 300° C. to 320° C. A shaping temperature of 270° C. or higher is preferable from a viewpoint of obtaining sufficient shaping fluidity and a shaping temperature of 340° C. or lower is preferable from a viewpoint of heat stability of the resin composition.

The average thickness of the black shaped product according to the present embodiment is preferably selected from a range of 0.8 mm to 3.2 mm. The average thickness is more preferably 1.0 mm to 3.0 mm, even more preferably 1.2 mm to 2.5 mm, and particularly preferably 1.2 mm to 2.0 mm. An average thickness of 3.2 mm or less is preferable from a viewpoint of weight-reduction and an average thickness of 0.8 mm or more is preferable from a viewpoint of maintaining sufficient shapability and strength.

The black shaped product according to the present embodiment is, for example, preferably shaped using a mirror surface shaping mold that has been polished with diamond paste or the like to reduce the surface roughness of the mold surface to a very low level (average surface roughness of 0.2 μm or less), but is not specifically limited to being shaped in this manner. The polishing grain size of the mirror surface shaping mold is preferably #1000 or more, more preferably #2000 or more, and particularly preferably #5000 or more. A polishing grain size of #1000 or more is preferable from a viewpoint of achieving adequate mirror surface external appearance.

The black shaped product according to the present embodiment includes a mirror surface part at the surface thereof. The gloss value of the mirror surface part of the black shaped product, when measured at a measurement angle of 20°, is preferably 90% to 140%, more preferably 95% to 140%, and even more preferably 100% to 140% from a viewpoint of balance between sufficient reflectiveness of light emitted from a light source and material design for maintaining adequate physical properties (heat resistance, mechanical strength, shaped product external appearance, etc.).

The black shaped product according to the present embodiment is preferably subjected to aluminum vapor deposition treatment with respect to part or all of the surface of the shaped product after shaping. Moreover, the black shaped product according to the present embodiment is preferably subjected to plasma treatment in advance of aluminum vapor deposition so as to activate the surface of the shaped product and thereby increase close adhesion to an aluminum film. Furthermore, after the aluminum vapor deposition, the surface of the shaped product is preferably subjected to coating with a silicon dioxide polymerized film through plasma polymerization treatment to prevent deterioration of external appearance or brightness caused by oxidization or the like.

With regards to the black shaped product according to the present embodiment, in the case of, for example, a black shaped product including a mirror surface part that is produced by the method described above, although this is not a specific limitation, the number of white spots (protrusions of 30 μm or more in diameter) present within a specific area (52.4 mm$^2$) of the mirror surface part is 30 or less, preferably 25 or less, more preferably 20 or less, and even more preferably 10 or less from a viewpoint of preserving good shaped product external appearance.

Through use of the specific resin composition described above, it is possible to obtain a black shaped product for which the number of white spots is within any of the ranges set forth above. Specifically, it is possible to obtain a black shaped product for which the number of white spots is within any of the ranges set forth above as a result of, in particular, the (C) component being contained in a specific amount and as a result of the (C) component preferably being compounded in a specific amount as the (C') component containing the (C) component.

In the present embodiment, the number of white spots is obtained by taking micrographs of the mirror surface parts of black shaped products (five shaped products) at ×40 magnification, counting the number of protrusions of 30 μm or more in diameter that are present in a single imaged field of view (area: 52.4 mm$^2$) for each of the five black shaped products, and dividing the total number for all five of the black shaped products by 5 to obtain the average number per one imaged field of view.

Furthermore, in shaping of the black shaped product according to the present embodiment, shaping may be performed with compounding, in part, of reworked (recycled) material (for example, fragments of a shaped product that has previously been shaped). The compounded proportion of reworked (recycled) material is preferably 0 mass % to 40 mass %, more preferably 2 mass % to 25 mass %, even more preferably 5 mass % to 15 mass %, and particularly preferably 5 mass % to 10 mass %. Compounding of 40 mass % or less is preferable from a viewpoint of maintaining adequate physical properties and external appearance.

EXAMPLES

The following provides a more specific description of the present embodiment through examples and comparative examples. However, the present embodiment is not limited to just the following examples. Physical property measurement methods and raw materials used in the examples and comparative examples are described below.

[Physical Property Measurement Methods]
1. Number of White Spots (Protrusions of 30 μm or More in Diameter)

With respect to five black shaped plates obtained in each of the examples and comparative examples, a digital microscope (model: VHX-1000; produced by Keyence Corporation) was used to take a micrograph of a central part (mirror surface part) of each of the black shaped plates at ×40 magnification. The number of protrusions of 30 μm or more in diameter that were present within one imaged field of view (area: 52.4 mm$^2$) was counted for each aluminum vapor deposited plate and the total count for five aluminum vapor deposited plates was divided by 5 to calculate the average number per one imaged field of view. This average number was taken to be the number of white spots.

2. Specific Gravity

With respect to a pre-aluminum vapor deposition shaped plate shaped in each of the examples and comparative examples, part of the shaped plate was cut out to obtain a sample of appropriate size, and the specific gravity of the sample was measured using an electronic densimeter SD-200L produced by Alfa Mirage.

3. External Appearance (by Eye) of Aluminum Vapor Deposited Surface of Aluminum Vapor Deposited Plate With respect to a light-reflective shaped product obtained in each of the examples and comparative examples, the external appearance of an aluminum vapor deposited surface thereof was observed by eye and was evaluated as excellent, good, or poor in accordance with the following ranks.
(Ranks)
Excellent: Number of protrusions/recesses of 0.2 mm or more in diameter observed by eye is less than 10 (within one surface of a 100 mm×100 mm×3 mm aluminum vapor deposited plate)
Good: Number of protrusions/recesses of 0.2 mm or more in diameter observed by eye is 10 or more and less than 30 (within one surface of a 100 mm×100 mm×3 mm aluminum vapor deposited plate)
Poor: Number of protrusions/recesses of 0.2 mm or more in diameter observed by eye is 30 or more (within one surface of a 100 mm×100 mm×3 mm aluminum vapor deposited plate)
Shaped plates having a rank of excellent or good were judged to be more suitable for use in the applications described herein.

4. Plate Color Unevenness

With respect to five black shaped plates obtained in each of the examples and comparative examples, color unevenness of the black shaped plates was observed by eye and was evaluated as good, satisfactory, or poor in accordance with the following ranks.
(Ranks)
Good: All five plates have uniform black color
Satisfactory: Non-uniform location only observed on one of the five plates
Poor: Non-uniform location observed on two or more of the five plates Shaped plates having a rank of good or satisfactory were judged to be more suitable for use in the applications described herein.

[Raw Materials]
<Polyphenylene Ether (A)>
(PPE-1)
Poly(2,6-dimethyl-1,4-phenylene) ether having a reduced viscosity of 0.40 dL/g (measured at 30° C. using chloroform solvent) was used (hereinafter, also referred to as "PPE-1").
(PPE-2)
Poly(2,6-dimethyl-1,4-phenylene) ether having a reduced viscosity of 0.35 dL/g (measured at 30° C. using chloroform solvent) was used (hereinafter, also referred to as "PPE-2").
<Styrene Resin (B)>
(GPPS)
General purpose polystyrene (Polystyrene 680® (Polystyrene 680 is a registered trademark in Japan, other countries, or both); produced by PS Japan Corporation; hereinafter also referred to as "GPPS") was used. Note that the general purpose polystyrene is polystyrene that does not include a rubber component and thus is non-rubber-reinforced polystyrene.
(AS)
A styrene-acrylonitrile resin (hereinafter, also referred to as "AS") produced as follows was used.

A mixed solution of 4.7 parts by mass of acrylonitrile, 73.3 parts by mass of styrene, 22 parts by mass of ethylbenzene, and 0.02 parts by mass of t-butylperoxy isopropyl carbonate as a polymerization initiator was continuously fed into a complete-mixing reactor of 5 L in capacity at a flow rate of 2.5 L/hr and was subjected to polymerization at 142° C. to yield a polymerization solution.

The resultant polymerization solution was then fed into a vented extruder, unreacted monomer and solvent were removed under conditions of 260° C. and 40 Torr, and polymer was then solidified by cooling and was finely cut to obtain a particulate styrene-acrylonitrile resin.

The composition of the styrene-acrylonitrile resin according to analysis by infrared absorption spectroscopy was 9 mass % of acrylonitrile units and 91 mass % of styrene units. The styrene-acrylonitrile resin had a melt flow rate of 78 g/10 min (measured in accordance with ASTM D 1238 at 220° C. and with a 10 kg load).
(HIPS)
Rubber-reinforced polystyrene (Polystyrene CT60® (Polystyrene CT60 is a registered trademark in Japan, other countries, or both); produced by Petrochemicals (Malaysia) Sdn Bhd; hereinafter, also referred to as "HIPS") was used.

In the present examples, the number average particle diameter and maximum particle diameter of rubber particles included in the rubber-reinforced polystyrene were determined by observing the rubber-reinforced polystyrene under a transmission electron microscope at ×10,000 magnification, measuring the particle diameters of 200 randomly selected rubber particles in the observed field of view, and then taking a maximum value among these measured values to be the maximum particle diameter and taking the number average value of these measured values to be the number average particle diameter.

<Carbon Black (C)>

Carbon black masterbatches (C') (CBMB-1 to 5) produced as follows were used as carbon black (C).

Production Example 1 (CBMB-1 and CBMB-2)

Pulverized Carbon Black Masterbatch

A Henschel mixer was used to mix 50 mass % of GPPS (Polystyrene 680® produced by PS Japan Corporation) and 50 mass % of the carbon black indicated below for 3 minutes, and then a Labo Plastomill produced by Toyo Seiki Seisaku-Sho, Ltd. was used to further mix these materials for 10 minutes at 200° C. After cooling, a mixed mass was removed and was pulverized using a pulverizer.

CBMB-1: A carbon black masterbatch was produced by the method set forth above using Medium Color Mitsubishi Carbon Black #980® (#980 is a registered trademark in Japan, other countries, or both). The amount of the carbon black masterbatch that passed through a No. 9 mesh (2 mm opening size) was 96%.

CBMB-2: A carbon black masterbatch was produced by the method set forth above using Medium Color Mitsubishi Carbon Black #960® (#960 is a registered trademark in Japan, other countries, or both). The amount of the carbon black masterbatch that passed through a No. 9 mesh (2 mm opening size) was 92%.

Production Example 2 (CBMB-3)

Granulated Carbon Black Masterbatch

A powdered carbon black masterbatch was obtained by the same method as in Production Example 1 using the carbon black of CBMB-2, and the powdered carbon black masterbatch was subsequently fed from a furthest upstream part (top feed) of a ZSK twin-screw extruder produced by Coperion Inc. (number of barrels: 10; screw diameter: 25 mm; L/D=44; screw pattern including 2 kneading discs L, 6 kneading discs R, and 2 kneading discs N) and was melt-kneaded at a temperature of 220° C., a screw rotation speed of 250 rpm, and a vent degree of vacuum of 7.998 kPa (60 Torr) to obtain pellets.

The amount of these pellets that passed through a No. 9 mesh was 30%. A carbon black masterbatch of these pellets is denoted as "CBMB-3".

Production Example 3 (CBMB-4)

Pulverized Carbon Black Masterbatch

A carbon black masterbatch pulverized product was obtained by the same method as in Production Example 1 through melt-mixing of 70 mass % of GPPS and 30 mass % of carbon black. The carbon black that was used was the same carbon black as used in CBMB-1. The amount of the pulverized product that passed through a No. 9 mesh (2 mm opening size) was 96%. This carbon black masterbatch is denoted as "CBMB-4".

Production Example 4 (CBMB-5)

Pulverized Carbon Black Masterbatch

A carbon black masterbatch pulverized product obtained by the same method as in Production Example 1 through melt-mixing of 30 mass % of GPPS and 70 mass % of carbon black. The carbon black that was used was the same carbon black as used in CBMB-1. The amount of the pulverized product that passed through a No. 9 mesh (2 mm opening size) was 96%. This carbon black masterbatch is denoted as "CBMB-5".

<Styrene Thermoplastic Elastomer (D)>

(Elastomer 1)

A styrene thermoplastic elastomer (hereinafter, also referred to as "Elastomer 1") was used that had a styrene block-hydrogenated butadiene block-styrene block structure with a butadiene block part hydrogenation rate of 99.9% and that had a bound styrene amount of 33%, a number average molecular weight Mn of 246,000, and an Mw/Mn value (weight average molecular weight/number average molecular weight) of 1.07.

(Elastomer 2)

A styrene thermoplastic elastomer (hereinafter, also referred to as "Elastomer 2") was used that had a styrene block-hydrogenated butadiene block-styrene block structure with a butadiene block part hydrogenation rate of 99.9% and that had a bound styrene amount of 60%, a number average molecular weight Mn of 83,800, and an Mw/Mn value (weight average molecular weight/number average molecular weight) of 1.20.

Note that in all the compositions of the examples and comparative examples, a phosphoric heat stabilizer 3,9-bis (2,6-di-tert-butyl-4-methylphenoxy)-2,4,8,10-tetraoxa-3,9-diphosphaspiro[5,5]undecane (ADK STAB PEP-36® (ADK STAB PEP 36 is a registered trademark in Japan, other countries, or both) produced by Adeka Corporation) was added as a heat stabilizer component in an amount of 0.35 parts by mass per 100 parts by mass of the composition.

Comparative Example 1

Resin composition pellets were obtained by feeding 80 mass % of PPE-1, 19 mass % of GPPS, and 1 mass % of CBMB-3 from a furthest upstream part (top feed) of a ZSK 25 twin-screw extruder (produced by Coperion Inc. (Germany); number of barrels: 10; screw diameter: 25 mm; L/D=44; screw pattern including 2 kneading discs L, 6 kneading discs R, and 2 kneading discs N) and melt-kneading these materials at a cylinder temperature of 300° C., a screw rotation speed of 250 rpm, and a vent degree of vacuum of 7.998 kPa (60 Torr).

The resultant resin composition pellets were dried for 3 hours in a 120° C. hot-air dryer. A black shaped product was then obtained by shaping the dried resin composition using an injection molding machine (IS-80EPN produced by Toshiba Machine Co., Ltd.) equipped with a film gate mirror surface mold having dimensions of 100 mm×100 mm×2 mm in thickness and having a surface that had been #5000 polished. The shaping was performed with a cylinder temperature of 320° C., a mold temperature of 120° C., an injection pressure (gauge pressure) of 70 MPa, and an injection rate (panel setting value) of 85%.

The obtained shaped plate was then set in a vapor deposition device in a vacuum state. An inert gas and oxygen were introduced into the device, plasma treatment was performed with a plasma state in a chamber of the device to activate the surface of the shaped plate, and then aluminum vapor deposition was performed on the shaped plate in the vapor deposition device under vacuum. Plasma polymerization treatment was performed to form a silicon dioxide polymerized film as a protective film for the aluminum vapor deposited surface and thereby obtain a light-reflective shaped product. The light-reflective shaped product had an aluminum film thickness of 80 nm and a silicon dioxide film thickness of 50 nm.

The results of physical property measurements for the obtained shaped plate, aluminum vapor deposited plate, and so forth are shown below in Table 1.

Examples 1 to 13 and Comparative Examples 2 to 6

A black shaped product and a light-reflective shaped product were obtained by the same method as in Comparative Example 1 with the exception that the types and/or ratios of raw materials were changed. The results are shown in Tables 1 and 2.

TABLE 1

|  | Comparative Example 1 | Example 1 | Example 2 | Example 3 | Example 4 | Comparative Example 2 | Comparative Example 3 |
|---|---|---|---|---|---|---|---|
| [Components (mass %)] | | | | | | | |
| (A) Component | 80 | 80 | 80 | 80 | 80 | 80 | 80 |
| (B) Component | 19.5 | 19.5 | 18.0 | 19.5 | 19.5 | 19.5 | 19.5 |
| (C) Component (Breakdown) | 0.5 | 0.5 | 2.0 | 0.5 | 0.5 | 0.5 | 0.5 |
| PPE-1 | 80 | 80 | 80 | 80 | 80 | 80 | 80 |
| PPE-2 | | | | | | | |
| GPPS | 19 | 19 | 16 | 19 | | 18.4 | 19.3 |
| HIPS | | | | | 19 | | |
| AS | | | | | | | |
| CBMB-1 (50/50, 96%) *1 | | 1 (0.5) | 4 (2.0) | | 1 (0.5) | | |
| CBMB-2 (50/50, 92%) *1 | | | | 1 | | | |
| CBMB-3 (50/50, 30%) *1 | 1 (0.5) | | | | | | |
| CBMB-4 (70/30, 96%) *1 | | | | | | 1.6 (0.5) | |
| CBMB-5 (30/70, 96%) *1 | | | | | | | 0.7 (0.5) |
| [Additional components (mass %)] | | | | | | | |
| (D) Component | | | | | | | |
| Total (mass) | 100 | 100 | 100 | 100 | 100 | 100 | 100 |
| [Physical properties] | | | | | | | |
| Specific gravity | 1.06 | 1.06 | 1.06 | 1.06 | 1.06 | 1.06 | 1.06 |
| Number of white spots (craters of 30 μm or more in diameter) | 64 | 4 | 12 | 5 | 4 | 32 | 124 |
| External appearance of aluminum vapor deposited plate (judged by eye) | Poor | Excellent | Good | Excellent | Excellent | Poor | Poor |
| Color unevenness | Good | Good | Good | Good | Good | Good | Good |

*1: The values in parentheses after each compound name indicate the ratio of the (B) component and the (C) component in the compound, and the amount of the compound that passes through a No. 9 mesh (2 mm opening size), and parentheses in the columns of values indicating the content of each compound show the content (mass %) of carbon black (C) in the compound.
*2: In each example and comparative example in the table, 0.35 parts by mass of a phosphoric stabilizer (3,9-bis(2,6-di-tert-butyl-4-methylphenoxy)-2,4,6,8,10-tetraoxa-3,9-diphosphaspiro[5,5]undecane) was added per 100 parts by mass of the composition in the table.

It can be seen from Table 1 that as a result of aluminum vapor deposited plates in Examples 1 to 4 each being obtained using a resin composition in which a carbon black masterbatch (C') that had been pulverized to a specific particle size was compounded as the (C) component, compared to the aluminum vapor deposited plate in Comparative Example 1 that was obtained using a resin composition in which a carbon black masterbatch (C') that had been granulated to a large particle size was compounded, the aluminum vapor deposited plates in Examples 1 to 4 had significantly fewer white spots in the mirror surface part thereof, had excellent external appearance, and were suitable for use as a light-reflective shaped product.

TABLE 2

|  | Comparative Example 4 | Example 5 | Example 6 | Example 7 | Example 8 | Example 9 | Example 10 |
|---|---|---|---|---|---|---|---|
| [Components (mass %)] | | | | | | | |
| (A) Component | 60 | 60 | 60 | 60 | 90 | 90 | 70 |
| (B) Component | 34.5 | 34.5 | 33.0 | 34.5 | 5.5 | 5.5 | 21.5 |
| (C) Component (Breakdown) | 0.5 | 0.5 | 2.0 | 0.5 | 0.5 | 0.5 | 0.5 |
| PPE-1 | 60 | 60 | 60 | | 90 | 90 | |
| PPE-2 | | | | 60 | | | 70 |
| GPPS | 34 | 34 | 31 | 34 | 5 | | 21 |
| HIPS | | | | | | | |
| AS | | | | | | 5 | |
| CBMB-1 (50/50 96%) *1 | | 1 (0.5) | 4 (2.0) | 1 (0.5) | 1 (0.5) | 1 (0.5) | 1 (0.5) |
| CBMB-2 (50/50, 92%) *1 | | | | | | | |
| CBMB-3 (50/50, 30%) *1 | 1 (0.5) | | | | | | |

TABLE 2-continued

| | | | | | | | |
|---|---|---|---|---|---|---|---|
| CBMB-4 (70/30, 96%) *1 | | | | | | | |
| CBMB-5 (30/70, 96%) *1 | | | | | | | |
| [Additional components (mass %)] | | | | | | | |
| (D) Component *2 (Breakdown) | 5 (5.3) | 5 (5.3) | 5 (5.3) | 5 (5.3) | 4 (4.2) | 4 (4.2) | 8 (8.7) |
| Elastomer 1 *2 | 2 (2.1) | 2 (2.1) | 2 (2.1) | 2 (2.1) | 2 (2.1) | 2 (2.1) | 2 (2.2) |
| Elastomer 2 *2 | 3 (3.2) | 3 (3.2) | 3 (3.2) | 3 (3.2) | 2 (2.1) | 2 (2.1) | 6 (6.5) |
| Total (mass %) | 100 | 100 | 100 | 100 | 100 | 100 | 100 |
| [Physical properties] | | | | | | | |
| Specific gravity | 1.06 | 1.05 | 1.05 | 1.05 | 1.07 | 1.07 | 1.05 |
| Number of white spots (craters of 30 μm or more in diameter) | 62 | 4 | 13 | 4 | 4 | 4 | 4 |
| External appearance of aluminum vapor deposited plate (judged by eye) | Poor | Excellent | Good | Excellent | Excellent | Excellent | Excellent |
| Color unevenness | Good | Good | Good | Good | Good | Good | Good |

| | Example 11 | Example 12 | Example 13 | Comparative Example 5 | Comparative Example 6 |
|---|---|---|---|---|---|
| [Components (mass %)] | | | | | |
| (A) Component | 40 | 60 | 60 | 60 | 40 |
| (B) Component | 54.5 | 34.5 | 34.9 | 31.5 | 54.5 |
| (C) Component (Breakdown) | 0.5 | 0.5 | 0.1 | 3.5 | 0.5 |
| PPE-1 | 40 | 60 | 60 | 60 | 40 |
| PPE-2 | | | | | |
| GPPS | 54 | 34 | 34 | 28 | 54 |
| HIPS | | | | | |
| AS | | | | | |
| CBMB-1 (50/50 96%) *1 | 1 (0.5) | 1 (0.5) | 0.2 (0.1) | 7 (3.5) | |
| CBMB-2 (50/50, 92%) *1 | | | | | |
| CBMB-3 (50/50, 30%) *1 | | | | | 1 (0.5) |
| CBMB-4 (70/30, 96%) *1 | | | | | |
| CBMB-5 (30/70, 96%) *1 | | | | | |
| [Additional components (mass %)] | | | | | |
| (D) Component *2 (Breakdown) | 5 (5.3) | 5 (5.3) | 5 (5.3) | 5 (5.3) | 5 (5.3) |
| Elastomer 1 *2 | 2 (2.1) | 2 (2.1) | 2 (2.1) | 2 (2.1) | 2 (2.1) |
| Elastomer 2 *2 | 3 (3.2) | 3 (3.2) | 3 (3.2) | 3 (3.2) | 3 (3.2) |
| Total (mass %) | 100 | 100 | 100 | 100 | 100 |
| [Physical properties] | | | | | |
| Specific gravity | 1.06 | 1.05 | 1.05 | 1.05 | 1.06 |
| Number of white spots (craters of 30 μm or more in diameter) | 5 | 5 | 3 | 54 | 62 |
| External appearance of aluminum vapor deposited plate (judged by eye) | Excellent | Excellent | Excellent | Poor | Poor |
| Color unevenness | Good | Good | Satisfactory | Good | Good |

*1: The values in parentheses after each compound name indicate the ratio of the (B) component and the (C) component in the compound and the amount of the compound that passes through a No. 9 mesh (2 mm opening size), and parentheses in the columns of values indicating the content of each compound show the content (mass %) of carbon black (C) in the compound.
*2: Parentheses in the columns of values indicating the content of each compound show the content (parts by mass) of the (D) component per 100 parts by mass, in total, of the (A) to (C) components.
*3: In each example and comparative example in the table, 0.35 parts by mass of a phosphoric stabilizer (3,9-bis(2,6-di-tert-butyl-4-methylphenoxy)-2,4,6,8,10-tetraoxa-3,9-diphosphaspiro[5,5]undecane) was added per 100 parts by mass of the composition in the table.

It can be seen from Table 2 that as a result of aluminum vapor deposited plates in Examples 5 to 13 each being obtained using a resin composition in which a carbon black masterbatch (C') that had been pulverized to a specific particle size was compounded as the (C) component, compared to the aluminum vapor deposited plate in Comparative Example 4 that was obtained using a resin composition in which a carbon black masterbatch (C') that had been granulated to a large particle size was compounded, the aluminum vapor deposited plates in Examples 5 to 13 had significantly fewer white spots in the mirror surface part of the black shaped product, had excellent external appearance, and were suitable for use as a light-reflective shaped product.

INDUSTRIAL APPLICABILITY

The disclosed black shaped product has low specific gravity, a good balance of heat resistance and fluidity, extremely few white spots at the shaped product surface (mirror surface part), and excellent aluminum vapor deposition external appearance, and thus can be effectively used as a light-reflective shaped product such as an automobile lamp reflector shaped product or an automobile lamp extension shaped product.

The invention claimed is:
1. A method of producing a black shaped product comprising:

producing a carbon black masterbatch (C') that passes through a No. 9 mesh having a 2 mm opening size in an amount of 90% or more by mixing and pulverizing 40 mass % to 60 mass % of a styrene resin (B) and 40 mass % to 60 mass % of carbon black (C);

producing a resin composition by melt-kneading 5 mass % to 95 mass % of a polyphenylene ether (A), 4.9 mass % to 90 mass % of a styrene resin (B), and 0.1 mass % to 5 mass % of the carbon black masterbatch (C'); and subsequently shaping the resin composition.

2. The method of producing a black shaped product according to claim 1, wherein in production of the carbon black masterbatch (C'), the styrene resin (B) and the carbon black (C) are melt-mixed using a Banbury mixer, a Labo Plastomill, or a roll other than an extruder, and a resultant melt-mixed product is cooled and subsequently pulverized.

* * * * *